(12) United States Patent
Profitt (10) Patent No.: US 9,164,600 B2
(45) Date of Patent: Oct. 20, 2015

(54) MOBILE DEVICE (75) Inventor: Phillip Profitt, Tokyo (JP)

(73) Assignees: Sony Corporation, Tokyo (JP); Sony Computer Entertainment Inc., Tokyo (JP)

(*) Notice: Subject to any disclaimer, the term of this patent is extended or adjusted under 35 U.S.C. 154(b) by 655 days.

(21) Appl. No.: 13/473,915

(22) Filed: May 17, 2012

(65) Prior Publication Data

US 2012/0296596 A1 Nov. 22, 2012

(30) Foreign Application Priority Data

May 20, 2011 (JP) ................................. 2011-113370

(51) Int. Cl.
| G06F 17/00 | (2006.01) |
| G01D 18/00 | (2006.01) |
| G06F 3/038 | (2013.01) |
| G01R 33/00 | (2006.01) |
| G06F 3/0346 | (2013.01) |
| G01C 17/38 | (2006.01) |

(52) U.S. Cl.
CPC ............ *G06F 3/038* (2013.01); *G01R 33/0035* (2013.01); *G06F 3/0346* (2013.01); *G01C 17/38* (2013.01)

(58) Field of Classification Search
CPC ......... E02F 9/123; E02F 9/2095; E02F 9/267; G01R 31/06; G01R 31/282; G01R 33/0035; G01C 17/38; G01C 19/5726
USPC ............. 702/104, 189, 183; 715/863; 360/26; 73/1.38; 345/156
See application file for complete search history.

(56) References Cited

U.S. PATENT DOCUMENTS

| 5,297,050 | A | * | 3/1994 | Ichimura et al. | ............... 701/445 |
| 6,842,991 | B2 | * | 1/2005 | Levi et al. | ........................ 33/356 |
| 7,119,533 | B2 | * | 10/2006 | Tamura et al. | ................ 324/202 |
| 8,240,186 | B2 | * | 8/2012 | Dunne | ........................... 73/1.38 |
| 8,811,728 | B2 | | 8/2014 | Otsuka | |
| 8,825,425 | B2 | * | 9/2014 | Kadokura | ....................... 702/92 |

(Continued)

FOREIGN PATENT DOCUMENTS

| CN | 101470177 A | 7/2009 |
| CN | 101806595 A | 8/2010 |

(Continued)

OTHER PUBLICATIONS

Office Action for corresponding Chinese Patent Application No. 2012101583751, dated Jul. 18, 2014.

(Continued)

*Primary Examiner* — John Breene
*Assistant Examiner* — Mohammad K Islam
(74) *Attorney, Agent, or Firm* — Matthew B. Dernier, Esq.

(57) ABSTRACT

Provided is a mobile device including a magnetic sensor and a posture detection sensor for detecting a posture of the mobile device independently of the magnetic sensor, which acquires output data of the magnetic sensor as a plurality of sampling data items in a plurality of states in which the posture detection sensor determines that the mobile device is directed in directions different from one another, the plurality of sampling data items respectively corresponding to the plurality of states, and calculates an offset value which is estimated to be output by the magnetic sensor when the magnetic sensor is not sensing geomagnetism based on the acquired plurality of sampling data items.

7 Claims, 3 Drawing Sheets

(56) References Cited

U.S. PATENT DOCUMENTS

| | | |
|---|---|---|
| 2005/0283988 A1* | 12/2005 | Sato et al. ............... 33/356 |
| 2006/0021238 A1* | 2/2006 | Sato et al. ............... 33/356 |
| 2006/0066295 A1 | 3/2006 | Tamura |
| 2008/0042973 A1* | 2/2008 | Zhao et al. .............. 345/156 |
| 2008/0316629 A1* | 12/2008 | Handa .................... 360/26 |
| 2009/0171608 A1 | 7/2009 | Handa |
| 2009/0202120 A1 | 8/2009 | Otsuka |
| 2010/0312513 A1* | 12/2010 | Mayor et al. ............ 702/104 |

FOREIGN PATENT DOCUMENTS

| | | |
|---|---|---|
| JP | 05164560 A | 6/1993 |
| JP | 2005265414 A | 9/2005 |
| JP | 2009162510 A | 7/2009 |
| JP | 2009186422 A | 8/2009 |
| JP | 2009186442 A | 8/2009 |
| WO | 2006035505 A1 | 4/2006 |

OTHER PUBLICATIONS

Office Action for corresponding Japanese Patent Application No. 2011-113370, dated Aug. 12, 2014.

Office Action for corresponding Japanese Patent Application No. 2011-113370, dated Jan. 21, 2014.

Office Action for corresponding Japanese Patent Application No. 2011-113370, dated Jul. 2, 2013.

* cited by examiner

MOBILE DEVICE

CROSS-REFERENCE TO RELATED APPLICATION

The present application claims priority from Japanese application JP 2011-113370 filed on May 20, 2011 the content of which is hereby incorporated by reference into this application.

BACKGROUND OF THE INVENTION

1. Field of the Invention

The present invention relates to a mobile device that calibrates an integrated magnetic sensor, a calibration method for a magnetic sensor, and an information storage medium having a program stored thereon, which is used for calibrating a magnetic sensor.

2. Description of the Related Art

A magnetic sensor is used for detecting the direction (azimuth) of a mobile device. The direction of the mobile device incorporating the magnetic sensor can be identified based on the direction of the geomagnetism detected by the magnetic sensor. The magnetic sensor has one or more reference axes, and outputs output values indicating magnitudes of magnetism along directions of the respective reference axes. The output value of the magnetic sensor is a sum of an offset value (output value acquired if the geomagnetism is not present) and a value corresponding to the magnitude of the geomagnetism, and the offset value changes depending on an influence of a surrounding magnetic field. It is thus necessary to precisely estimate the offset value in order to identify the direction of the geomagnetism using output data of the magnetic sensor. Calibration processing is thus carried out for estimating the offset value. Specifically, the mobile device acquires the output data of the magnetic sensor while prompting a user to perform an action of rotating the mobile device, for example. As a result of this operation, both an output acquired when the reference axis of the magnetic sensor coincides with the geomagnetism, and an output acquired when the reference axis is opposite to the geomagnetism are acquired. The offset value is then calculated by means of a method such as averaging the maximum value and the minimum value of the output value of the magnetic sensor acquired during this operation.

It is necessary to prompt a user to intentionally perform a special action in order to carry out such calibration processing as described above. If the calibration to be carried out by simply using sampling data items acquired by sampling outputs of the magnetic sensor for certain number of times without the special action, the offset value having a sufficient accuracy may not be obtained. This is because sampling data items are necessary respectively obtained before and after a relatively large change in the posture of the mobile device in order to carry out the calibration processing, and it is not possible to guarantee that such a change of the posture occurs in the mobile device unless the user is prompted to perform the special action.

SUMMARY OF THE INVENTION

The present invention has been made in view of above-mentioned problem, and therefore has an object to provide a mobile device capable of precisely calculating an offset value of a magnetic sensor without prompting a user to perform a special action for the calibration, a calibration method for a magnetic sensor, and an information storage medium having a program therefor stored thereon.

According to the present invention, there is provided a mobile device including: a magnetic sensor; a posture detection sensor for detecting a posture of the mobile device independently of the magnetic sensor; a sampling data acquisition section for acquiring output data of the magnetic sensor as a plurality of sampling data items in a plurality of states in which the posture detection sensor determines that the mobile device is directed in directions different from one another, the plurality of sampling data items respectively corresponding to the plurality of states; and an offset value calculation section for calculating an offset value which is estimated to be output by the magnetic sensor when the magnetic sensor is not sensing geomagnetism based on the acquired plurality of sampling data items.

Further, according to the present invention, there is provided a calibration method for a magnetic sensor for a mobile device including the magnetic sensor and a posture detection sensor for detecting a posture of the mobile device independently of the magnetic sensor, the calibration method including: acquiring output data of the magnetic sensor as a plurality of sampling data items in a plurality of states in which the posture detection sensor determines that the mobile device is directed in directions different from one another, the plurality of sampling data items respectively corresponding to the plurality of states; and calculating an offset value which is estimated to be output by the magnetic sensor when the magnetic sensor is not sensing geomagnetism based on the acquired plurality of sampling data items.

Further, according to the present invention, there is provided a non-transitory computer-readable information storage medium having a calibration program stored thereon, the calibration program being used for a magnetic sensor for a mobile device including the magnetic sensor and a posture detection sensor for detecting a posture of the mobile device independently of the magnetic sensor, the calibration program including instructions that cause a computer to: acquiring output data of the magnetic sensor as a plurality of sampling data items in a plurality of states in which the posture detection sensor determines that the mobile device is directed in directions different from one another, the plurality of sampling data items respectively corresponding to the plurality of states; and calculating an offset value which is estimated to be output by the magnetic sensor when the magnetic sensor is not sensing geomagnetism based on the acquired plurality of sampling data items.

DETAILED DESCRIPTION OF THE INVENTION

A mobile device according to an embodiment of the present invention includes: a magnetic sensor; a posture detection sensor for detecting a posture of the mobile device independently of the magnetic sensor; a sampling data acquisition section for acquiring output data of the magnetic sensor as a plurality of sampling data items in a plurality of states in which the posture detection sensor determines that the mobile device is directed in directions different from one another, the plurality of sampling data items respectively corresponding to the plurality of states; and an offset value calculation section for calculating an offset value which is estimated to be output by the magnetic sensor when the magnetic sensor is not sensing geomagnetism based on the acquired plurality of sampling data items.

In the mobile device, the sampling data acquisition section may acquire the plurality of sampling data items in a plurality of states in which the posture detection sensor determines that the mobile device is directed in directions different from one another by a predetermined angle or larger, the plurality of sampling data items respectively corresponding to the plurality of states.

The mobile device may further include a storage unit for storing an offset value, in which the offset value calculation section may evaluate reliability for a newly calculated offset value, and may update the offset value stored in the storage unit by using a value obtained by correcting the calculated offset value in accordance with the evaluation of the reliability.

Further, the offset value calculation section may evaluate the reliability of the newly calculated offset value based on the offset value which has been stored and the newly calculated offset value.

A detailed description is now given of the embodiment of the present invention referring to drawings.

Figure 1:
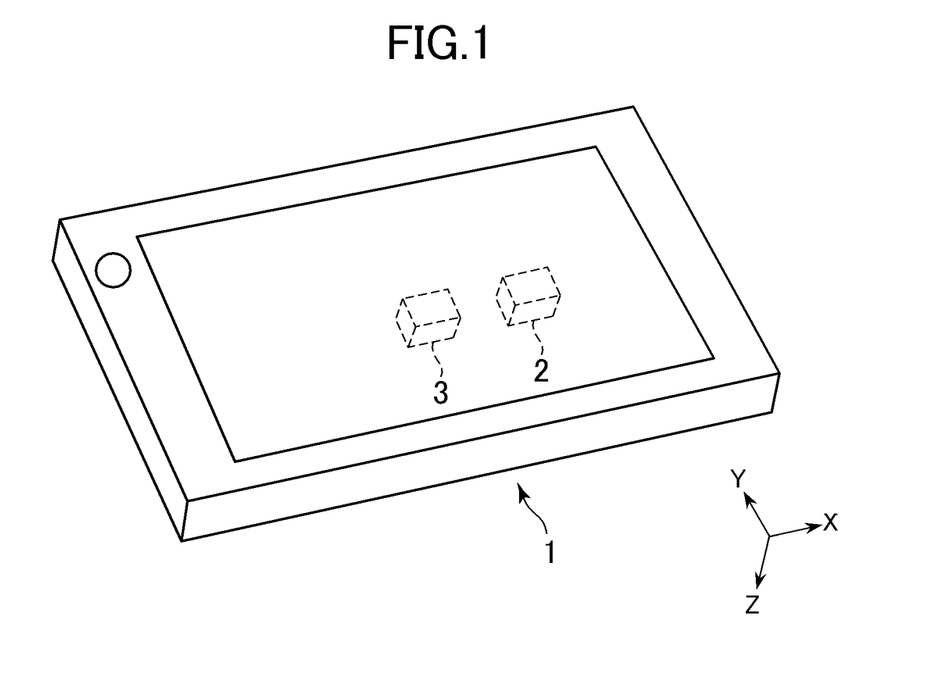
FIG. 1 is a perspective view illustrating an exterior of a mobile device according to an embodiment of the present invention.

FIG. 1 is a perspective view illustrating an exterior of a mobile device 1 according to the embodiment of the present invention. The mobile device 1 is a portable device such as a mobile game machine, a cellular phone, and a smart phone, and incorporates a magnetic sensor 2, and a gyroscope 3 as illustrated in FIG. 1.

The magnetic sensor 2 is a sensor for detecting a direction and a magnitude of magnetism. The magnetic sensor 2 is a three-axis sensor for detecting the magnitudes of magnetism in directions respectively along three reference axes orthogonal to each other and set to the mobile device 1 according to this embodiment. Specifically, the magnetic sensor 2 is disposed in the mobile device 1 so that the three reference axes, namely, X axis, Y axis, and Z axis respectively coincide with the left/right direction, the up/down direction, and the depth direction of the mobile device 1. The magnetic sensor 2 outputs output data constructed by three output values ($x_M$, $y_M$, $z_M$) representing the magnitudes of the magnetism respectively along the three reference axes. The mobile device 1 can identify the direction of the geomagnetism using the output data of the magnetic sensor 2.

The gyroscope 3 is a sensor for detecting angular velocities of rotations about predetermined reference axes. In this embodiment, the gyroscope 3 is a three-axis sensor for detecting angular velocities of rotations about three reference axes as the magnetic sensor 2. Further, the gyroscope 3 is disposed in the mobile device 1 so that the three reference axes thereof coincide with the three reference axes of the magnetic sensor 2. The mobile device 1 can acquire information on rotation angles by integrating the output of the gyroscope 3 when the mobile device 1 rotates. This information represents an amount of a change in the direction (posture) of the mobile device 1.

Figure 2:
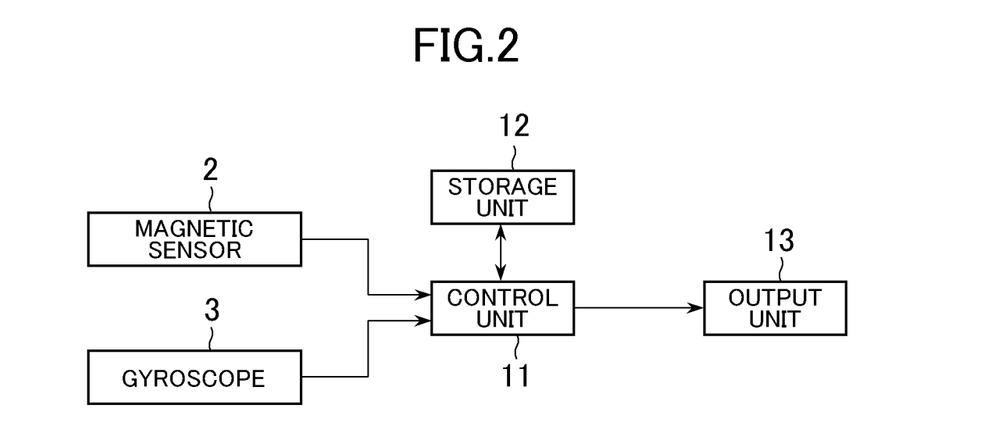
FIG. 2 is a block diagram illustrating an internal configuration of the mobile device according to this embodiment.

FIG. 2 is a configuration block diagram illustrating an internal configuration of the mobile device 1. The mobile device 1 includes a control unit 11, a storage unit 12, and an output unit 13 as illustrated in FIG. 2.

The control unit 11 includes a CPU or the like, and carries out various types of information processing according to programs stored in the storage unit 12. In this embodiment, the control unit 11 reads the output data from the magnetic sensor 2 and the gyroscope 3, and carries out calibration processing for the magnetic sensor 2 based on the data. Offset values of the magnetic sensor 2 acquired as a result of the calibration processing are stored in the storage unit 12, and are used for correcting the output data of the magnetic sensor 2.

The storage unit 12 is constructed by a memory device such as a RAM and a ROM, and stores the programs executed by the control unit 11 and various types of data. Moreover, the storage unit 12 functions as a working memory for the control unit 11.

The output unit 13 is an image display device such as a liquid crystal display, a speaker, or the like, and outputs a result of the processing carried out by the control unit 11.

A description is now given of an overview of the calibration processing for the magnetic sensor 2 according to this embodiment. The output value for each of the reference axes of the magnetic sensor 2 is generally a sum of the magnitude of the magnetic field generated by the geomagnetism and the offset value. The offset value is a value output by the magnetic sensor 2 if there is no influence from the geomagnetism. For example, if the mobile device 1 is disposed so that any one of the reference axis is orthogonal to the direction of the geomagnetism, the magnitude of the geomagnetism in the direction of this reference axis is zero, and the output value for this reference axis of the magnetic sensor 2 coincides with the offset value. Note that, the offset values for the X axis, Y axis, and Z axis are respectively denoted by $x_0$, $y_0$, and $z_0$. These offset values vary depending on operating environments of the magnetic sensor 2 such as the magnetic field and the temperature around the mobile device 1. The mobile device 1 according to this embodiment carries out processing of periodically estimating the current offset values, and storing the estimated offset values in the storage unit 12. This processing is referred to as the calibration processing for the magnetic sensor 2 hereinafter. The mobile device 1 acquires the values representing the magnitudes of the magnetic field generated by the geomagnetism by respectively subtracting the offset values stored in the storage unit 12 from the output values for the reference axes of the magnetic sensor 2. As a result, the mobile device 1 can identify the direction of the geomagnetism with respect to the mobile device 1 itself.

Figure 3:
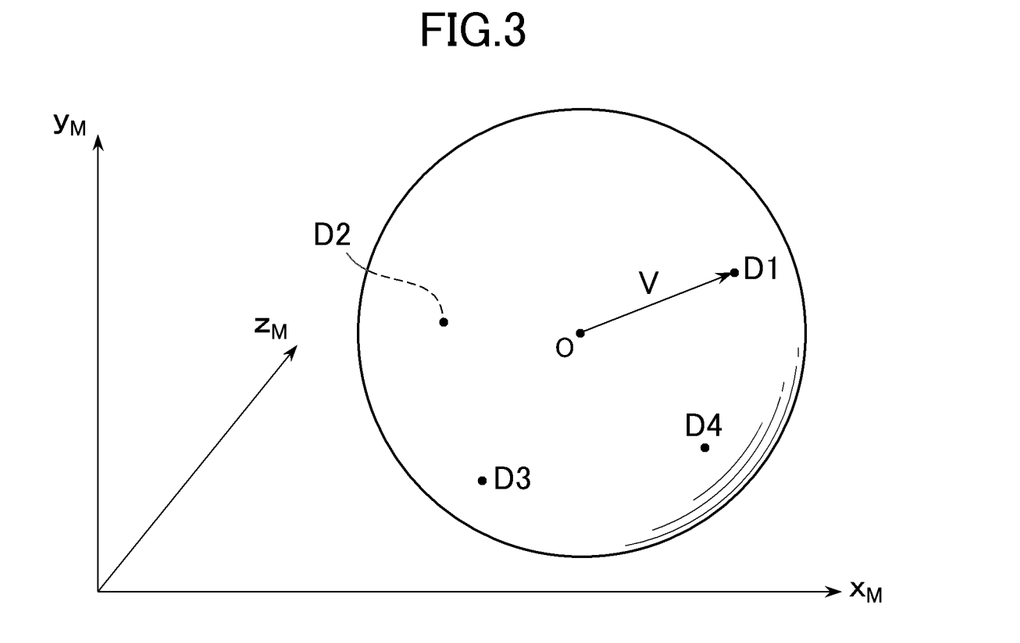
FIG. 3 is a diagram illustrating an output-value space of a magnetic sensor.

The offset values are estimated as mentioned below. The mobile device 1 acquires the output data of the magnetic sensor 2 as sampling data items D in a plurality of states in which the mobile device 1 is directed in directions different from one another. The sampling data item D is constructed by output values from the magnetic sensor respectively for the X, Y, and Z axes. Here, a virtual three-dimensional space having the output values ($x_M$, $y_M$, $z_M$) for the respective reference axes of the magnetic sensor 2 as coordinate axes is considered. This virtual three-dimensional space is referred to as output-value space of the magnetic sensor 2 hereinafter. The sampling data item D constructed by the three output values corresponds to one point in the output-value space. Moreover, offset data constructed by a set of offset values for the respective reference axes ($x_0$, $y_0$, $z_0$) also corresponds to one point in the output-value space. A point in the output-value space corresponding to the offset data is referred to as reference point O hereinafter. Further, if a vector representing the direction and the magnitude of the geomagnetism at a time point when the sampling data item D is acquired is referred to as geomagnetic vector V, the point corresponding to the sampling data item D in the output-value space of the magnetic sensor 2 must coincide with an end point of the geomagnetic vector V while the reference point O is set to a start point thereof. In other words, if the respective reference axis components of the geomagnetic vector V are $x_V$, $y_V$, and $z_V$, the following relationships hold true.

$$x_V = x_M - x_0$$

$$y_V = y_M - y_0$$

$$z_V = z_M - z_0$$

As a result, it is considered that any of a plurality of sampling data items D acquired by changing the direction of the mobile device 1 are present on the surface of a sphere the center of which is at the reference point O and the radius of which is equal to the magnitude of the geomagnetism vectors V in the output-value space if the position of the reference point O and the magnitude of the geomagnetism vectors V do not change.

The mobile device 1 thus acquires a plurality of sampling data items D, and calculates a center point of a sphere on which respective points in the output-value space corresponding to these sampling data items D are present. It is estimated that this center point is a position of the reference point O. In other words, the mobile device 1 estimates the offset values by acquiring a plurality of sampling data items D and calculating a coordinate of a position of a point in the output-value space which is at an equal distance from any of points corresponding to these sampling data items D. At least four sampling data items D which are not on the same plane are necessary for uniquely determining a spherical surface in order to estimate the offset values. Note that, the offset values can be estimated more precisely as the number of the sampling data items D increases. FIG. 3 illustrates the output-value space, and illustrates a state in which points respectively corresponding to sampling data items D1 to D4 are positioned on the surface of a sphere the center of which is the reference point O corresponding to offset data.

On this occasion, the plurality of sampling data items D used for estimating the offset value are preferably obtained in states in which the mobile device 1 is in directions separated from one another as much as possible. This is because the surface of the sphere cannot be precisely approximated only with sampling data items D obtained in directions relatively close to one another. The mobile device 1 according to this embodiment uses the gyroscope 3 as a sensor for detecting the posture of the mobile device 1 independently of the magnetic sensor 2, thereby determining timing for acquiring the sampling data item D used for calibrating the magnetic sensor 2. Specifically, the mobile device 1 periodically acquires output data of the gyroscope 3, and acquires the output data of the magnetic sensor 2 as new sampling data item D in timing when it is determined from the acquired output data of the gyroscope 3 that the posture of the mobile device 1 has largely changed from when previous sampling data item D was acquired. Even if the user does not intentionally change the posture of the mobile device 1, the mobile device 1 can acquire the sampling data items D for the calibration in timing when the direction of the mobile device 1 naturally changes while the mobile device 1 is used by the user in this way.

Figure 4:
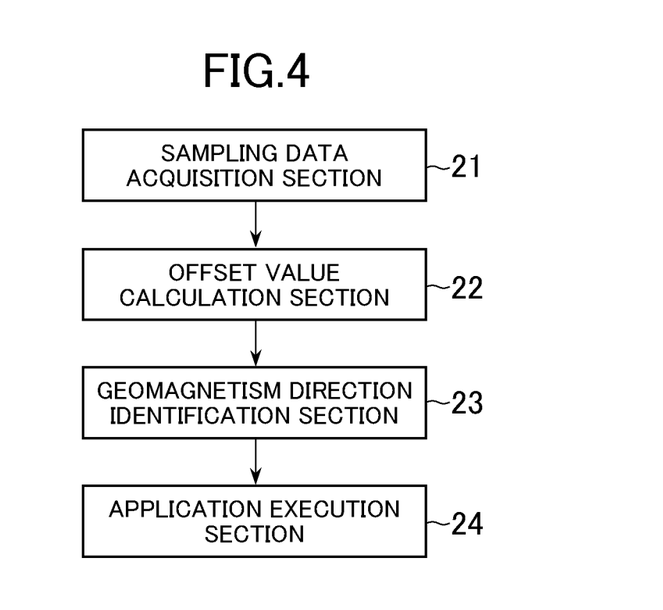
FIG. 4 is a functional block diagram illustrating functions of the mobile device according to this embodiment.

A description is now given of functions realized by the mobile device 1 according to this embodiment. The mobile device 1 is functionally constructed by a sampling data acquisition section 21, an offset value calculation section 22, a geomagnetism direction identification section 23, and an application execution section 24. These functions are realized by the control unit 11 executing the programs stored in the storage unit 12.

The sampling data acquisition section 21 acquires at least four sampling data items D for calibrating the magnetic sensor 2. Particularly, the sampling data acquisition section 21 periodically acquires the detection result by the gyroscope 3, and determines the timing for acquiring the sampling data items D based on the acquired detection result by the gyroscope 3. The sampling data acquisition section 21 determines whether or not the direction of the mobile device 1 has changed by a predetermined angle from a direction at a time point when the sampling data item D was previously acquired using the detection result by the gyroscope 3, for example. The sampling data acquisition section 21 then acquires the output data of the magnetic sensor 2 as new sampling data item D when the sampling data acquisition section 21 determines that the mobile device 1 has rotated by an angle equal to or more than the predetermined angle. The sampling data acquisition section 21 acquires at least four sampling data items D by repeating this processing.

The offset value calculation section 22 calculates offset values $(x_0, y_0, z_0)$ for the respective reference axes using the at least four sampling data items D acquired by the sampling data acquisition section 21, and stores the calculated offset values in the storage unit 12. Specifically, the offset value calculation section 22 calculates, as the offset values, coordinate values of the center point of a sphere passing through points in the output-value space respectively corresponding to the plurality of sampling data items D. If the offset values previously calculated are stored in the storage unit 12, the offset value calculation section 22 updates the stored values with the newly calculated offset values.

A description is now given of a specific example of calculation equations for calculating the offset values using four sampling data items D1 to D4. If the respective reference axis components of the sampling data item Di (i=1, 2, 3, 4) is denoted by $(x_i, y_i, z_i)$, the equation of a sphere passing through points corresponding to these four sampling data items D1 to D4 is represented by the following determinant.

$$\begin{vmatrix} x^2+y^2+z^2 & x & y & z & 1 \\ x_1^2+y_1^2+z_1^2 & x_1 & y_1 & z_1 & 1 \\ x_2^2+y_2^2+z_2^2 & x_2 & y_2 & z_2 & 1 \\ x_3^2+y_3^2+z_3^2 & x_3 & y_3 & z_3 & 1 \\ x_4^2+y_4^2+z_4^2 & x_4 & y_4 & z_4 & 1 \end{vmatrix} = 0 \quad \text{[Math. 1]}$$

The following equation (1) for the sphere is acquired by expanding the determinant.

[Math. 2]

$$(x^2+y^2+z^2)M_{11} - xM_{12} + yM_{13} - zM_{14} + M_{15} = 0 \quad (1)$$

$M_{11}$, $M_{12}$, $M_{13}$, $M_{14}$, and $M_{15}$ in the equation (1) are values respectively defined by the following determinants, and any of them are calculated by the coordinate values of the sampling data items D1 to D4.

$$M_{11} = \begin{vmatrix} x_1 & y_1 & z_1 & 1 \\ x_2 & y_2 & z_2 & 1 \\ x_3 & y_3 & z_3 & 1 \\ x_4 & y_4 & z_4 & 1 \end{vmatrix} \quad \text{[Math. 3]}$$

-continued $$M_{12} = \begin{vmatrix} x_1^2+y_1^2+z_1^2 & y_1 & z_1 & 1 \\ x_2^2+y_2^2+z_2^2 & y_2 & z_2 & 1 \\ x_3^2+y_3^2+z_3^2 & y_3 & z_3 & 1 \\ x_4^2+y_4^2+z_4^2 & y_4 & z_4 & 1 \end{vmatrix} \quad [\text{Math. 4}]$$

$$M_{13} = \begin{vmatrix} x_1^2+y_1^2+z_1^2 & x_1 & z_1 & 1 \\ x_2^2+y_2^2+z_2^2 & x_2 & z_2 & 1 \\ x_3^2+y_3^2+z_3^2 & x_3 & z_3 & 1 \\ x_4^2+y_4^2+z_4^2 & x_4 & z_4 & 1 \end{vmatrix} \quad [\text{Math. 5}]$$

$$M_{14} = \begin{vmatrix} x_1^2+y_1^2+z_1^2 & x_1 & y_1 & 1 \\ x_2^2+y_2^2+z_2^2 & x_2 & y_2 & 1 \\ x_3^2+y_3^2+z_3^2 & x_3 & y_3 & 1 \\ x_4^2+y_4^2+z_4^2 & x_4 & y_4 & 1 \end{vmatrix} \quad [\text{Math. 6}]$$

$$M_{15} = \begin{vmatrix} x_1^2+y_1^2+z_1^2 & x_1 & y_1 & z_1 \\ x_2^2+y_2^2+z_2^2 & x_2 & y_2 & z_2 \\ x_3^2+y_3^2+z_3^2 & x_3 & y_3 & z_3 \\ x_4^2+y_4^2+z_4^2 & x_4 & y_4 & z_4 \end{vmatrix} \quad [\text{Math. 7}]$$

The equation (1) can be transformed into the following equation.

$$\left(x - \frac{M_{12}}{2M_{11}}\right)^2 + \left(y + \frac{M_{13}}{2M_{11}}\right)^2 + \left(z - \frac{M_{14}}{2M_{11}}\right)^2 = \\ \left(\frac{M_{12}}{2M_{11}}\right)^2 + \left(\frac{M_{13}}{2M_{11}}\right)^2 + \left(\frac{M_{14}}{2M_{11}}\right)^2 - \frac{M_{15}}{M_{11}} \quad [\text{Math. 8}]$$

As appreciated from this equation, the offset values ($x_0$, $y_0$, $z_0$) corresponding to the position coordinate of the center of the sphere is calculated by the following equation.

$$x_0 = \frac{M_{12}}{2M_{11}}, \ y_0 = -\frac{M_{13}}{2M_{11}}, \ z_0 = \frac{M_{14}}{2M_{11}} \quad [\text{Math. 9}]$$

Note that, the radius of the sphere corresponding to the magnitude of the geomagnetism is represented by the following equation.

$$r = \sqrt{x_0^2 + y_0^2 + z_0^2 - \frac{M_{15}}{M_{11}}} \quad [\text{Math. 10}]$$

The geomagnetic identification section 23 identifies the direction of the geomagnetism with respect to the mobile device 1 by using the output result of the magnetic sensor 2 and the offset data stored in the storage unit 12 by the offset value calculation section 22, and outputs information on the identified direction.

The application execution section 24 executes the application programs stored in the storage unit 12. In this embodiment, the application execution section 24 carries out processing utilizing the direction of the geomagnetism output by the geomagnetism direction identification section 23, and outputs a result thereof to the output unit 13. For example, the application execution section 24 executes an application program for displaying a map, and changes the orientation of the map to be displayed in accordance with a change in the direction of the geomagnetism.

Figure 5:
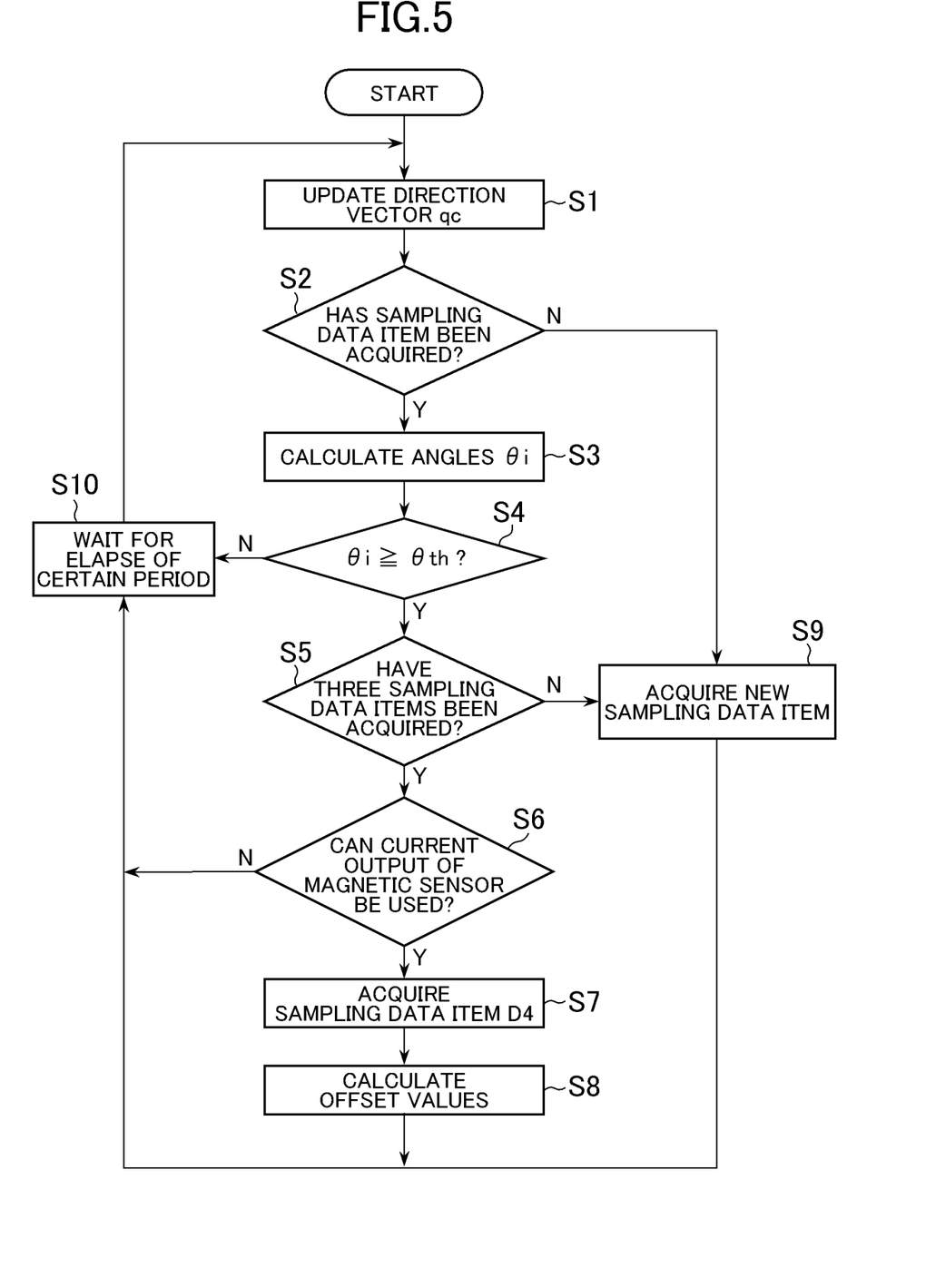
FIG. 5 is a flowchart illustrating an example of offset value update processing carried out by the mobile device according to this embodiment.

A description is now given of a specific example of offset value update processing carried out by the mobile device 1 referring to the flowchart of FIG. 5. Note that, a processing sequence described below is an example, and the mobile device 1 may update the offset values in accordance with a sequence different from this sequence.

The mobile device 1 acquires four sampling data items D1 to D4, and calculates the offset values using the sampling data items D1 to D4 in this processing. Vectors indicating directions of the mobile device 1 at time points when the four sampling data items D1 to D4 are respectively acquired are denoted by direction vectors q1 to q4 in the following description. Moreover, the mobile device 1 stores a direction vector qc representing the current direction of the mobile device 1 in the storage unit 12. These direction vectors represent relative directions of the mobile device 1 with respect to the direction of the mobile device 1 at a reference time point serving as a reference, and are calculated by integrating the detection result of the gyroscope 3 (namely, rotational angles about the respective reference axes of the mobile device 1 per unit time) with the reference time point as a start. These direction vectors are three-dimensional vectors pointing one direction in the three-dimensional space.

The sampling data acquisition section 21 first acquires a current detection result by the gyroscope 3, and updates the current direction vector of the mobile device 1 based on the acquired detection result of the gyroscope 3 (S1). Specifically, the sampling data acquisition section 21 updates the information on the direction vector qc by changing the direction indicated by the direction vector qc stored in the storage unit 12 using the information on the rotation angle indicated by the detection result by the gyroscope 3.

The sampling data acquisition section 21 then determines whether or not sampling data items D already acquired are present (S2). If sampling data items D have already been acquired, the sampling data acquisition section 21 acquires respective angles θi between the direction vector qc updated in S1 and direction vectors qi (i=1, 2, 3) when the previous sampling data items D were acquired (S3). Specifically, if three sampling data items D1 to D3 have already been acquired, for example, the sampling data acquisition section 21 respectively calculates an angle θ1 between the direction vector qc and the direction vector q1, an angle θ2 between the direction vector qc and the direction vector q2, and an angle θ3 between the direction vector qc and the direction vector q3. The angle θi between the direction vector qc and the direction vector qi can be calculated by obtaining an inner product of these vectors. In other words, θi is calculated in accordance with the following equation.

$$\theta i = \text{Arccos}\left(\frac{qc \cdot qi}{|qc||qi|}\right) \quad [\text{Math. 11}]$$

The sampling data acquisition section 21 then determines whether or not the calculated angles θi in the step S3 are equal to or more than a predetermined threshold θth (S4). If two or more sampling data items D have already been acquired and a plurality of angles θi have been calculated in S3, the sampling data acquisition section 21 determines whether or not all the angles are equal to or more than the threshold θth. For example, if three sampling data items D have already been acquired, for example, the sampling data acquisition section 21 determines whether or not all the angles θ1 to θ3 calculated in S3 are equal to or more than threshold θth. If all the angles θ1 to θ3 calculated in S3 are equal to or more than threshold θth as a result of the determination, the current direction of the mobile device 1 is different by an angle equal to or more than the angle θth from any of the directions when the sampling data items D have previously been acquired. If the sampling data acquisition section 21 determines that at least one of the angles θi is less than the threshold θth, the sampling data acquisition section 21 determines not to use the output data of the magnetic sensor 2 at that time point as the sampling data item D.

If the sampling data acquisition section 21 determines that all the angles θi are equal to or more than the threshold θth in S4, the sampling data acquisition section 21 determines whether or not three sampling data items D1-D3 have already been acquired (S5). If three sampling data items D1-D3 have already been acquired, the sampling data acquisition section 21 determines whether or not the current output data of the magnetic sensor 2 can be used as new sampling data item D4 (S6). Specifically, the sampling data acquisition section 21 determines that the output data cannot be used as the sampling data item D4 if the current output data of the magnetic sensor 2 and the three sampling data items D1-D3 already acquired are on the same plane in the output-value space. Otherwise, the current output data of the magnetic sensor 2 is acquired as new sampling data item D4 (S7). Then, the offset value calculation section 22 calculates new offset values using the four sampling data items D1-D4, and updates the offset values stored in the storage unit 12 with the newly calculated values (S8).

If the sampling data acquisition section 21 determines that the sampling data item D has not been acquired yet in S2, or that the number of the sampling data items D is less than three in S5, the sampling data acquisition section 21 acquires the current output data of the magnetic sensor 2 as new sampling data item Di unconditionally (S9). When the sampling data acquisition section 21 acquires the new sampling data item Di, the sampling data acquisition section 21 stores the direction vector qc of the mobile device 1 at this time point as a direction vector qi corresponding to the sampling data item Di in the storage unit 12.

If the sampling data acquisition section 21 determines that the current output data of the magnetic sensor 2 cannot be used as the sampling data item D in S4 or S6, or the processing in S8 or S9 has been finished, the sampling data acquisition section 21 waits for elapse of a predetermined period (S10), returns to S1, and tries to acquire new sampling data item D.

In the above-mentioned example of processing, if the offset values are updated in S8, the sampling data acquisition section 21 deletes the sampling data item D1 acquired least recently out of the four sampling data items D used for updating the offset values, sets the remaining sampling data items D2-D4 to new sampling data items D1-D3, and tries to acquire next sampling data item D4. The mobile device 1 can continue the update of the offset values using the latest sampling data items D by repeating this processing.

If newly acquired output data of the magnetic sensor 2 is at a distance equal to or shorter than a predetermined distance to any of sampling data items D already acquired in the output-value space, the sampling data acquisition section 21 may not employ this output data as sampling data item D. This is because if a distance between any two of a plurality of sampling data items D in the output-value space is so close that the distance is equal to or less than the predetermined value, the offset values may not be precisely calculated.

Further, the offset value calculation section 22 may calculate an index value indicating reliability of newly calculated offset values (hereinafter, referred to as calculated offset values) based on the sampling data by means of the processing described above. The reliability of the calculated offset value is an index indicating how the calculated offset value is close to a true offset value (namely, actual output value of the magnetic sensor 2 if the geomagnetism is not present). For example, if the calculated offset value is largely different from the offset value which has been used previously, the offset value may be calculated using sampling data item D containing an error. The offset value calculation section 22 thus determines that the reliability of the calculated offset value is higher as the calculated offset value is closer to the offset value previously used.

Moreover, the offset value calculation section 22 may evaluate the reliability of the calculated offset values by comparing a change in the direction of the geomagnetism identified by the geomagnetism direction identification section 23 using the calculated offset values and a change in the direction of the mobile device 1 identified based on the detection result by the gyroscope 3. The change in the direction of the geomagnetism identified by the geomagnetism direction identification section 23 and the change in the direction of the mobile device 1 detected by the gyroscope 3 must usually coincide with each other. Therefore, if the direction of the geomagnetism identified by using the calculated offset values deviates from the direction estimated based on the change in the direction of the mobile device 1 detected by the gyroscope 3, the estimation of the calculated offset values may not be correct, and it is estimated that the reliability of the calculated offset values is low.

The offset value calculation section 22 may weight the calculated offset values in accordance with the indices of the reliability estimated in this way, thereby determining offset values (offset values after the update) actually used by the geomagnetism direction identification section 23 for identifying the direction of the geomagnetism. Specifically, if the reliability of the calculated offset values is low, the offset values stored in the storage unit 12 (offset values before the update) are not changed largely, and sets values which correspond to a position slightly close to the calculated offset values from the offset values before the update in the output-value space to the offset values after the update. Conversely, if the reliability of the calculated offset values is high, values closer than the offset values before the update to the calculated offset values are set to the offset values after the update. As a result, the offset values actually used for identifying the direction of the geomagnetism can be updated depending on the reliability of the calculated offset value.

Though the three offset values for the three reference axes are always updated at once in the above description, the offset value calculation section 22 may not update an offset value for a specific reference axis depending on the direction of the mobile device 1 when the sampling data acquisition section 21 acquires the sampling data items D. Specifically, if a rotation about a certain axis (axis of interest) is detected while rotations about the remaining two axes are not detected, the direction for the axis of interest is not changed. Information on the offset value of the axis of interest is not acquired in this case, the offset value for the axis of interest is not updated, and the offset values only for the other two axes are updated using the calculated offset values. As a specific example, the offset value calculation section 22 calculates information on amounts of rotation indicating how much the respective reference axes have rotated while acquiring a plurality of sampling data items D used for calculating the offset values. The information on the amounts of the rotation can be calculated by integrating the output of the gyroscope 3 for the respective axes. The output of the gyroscope 3 for the X axis indicates a rotation angle about the X axis, namely, respective amounts of rotation of the Y axis and Z axis orthogonal to the X axis, and the output of the gyroscope 3 for the Y axis indicates a rotation angle about the Y axis, namely, respective amounts of rotation of the X axis and Z axis orthogonal to the Y axis, for example. This means that the amount of rotation of the Z axis can be calculated from outputs of the gyroscope 3 for the X axis and Y axis. Then, for a reference axis, the amount of rotation of which acquired in this way is less than a predetermined value, it is considered that the direction of this reference axis has changed little, and the offset value for this reference axis is excluded from the subject of update.

Moreover, the offset value calculation section 22 may use the information on the amount of rotation for each of the reference axes for estimating the reliability described above. Specifically, for a reference axis the amount of rotation of which is small while the sampling data items D are acquired, the offset value calculation section 22 evaluates the reliability of the offset value calculated using the sampling data items D as low, and conversely, for a reference axis the amount of rotation of which is large, the offset value calculation section 22 evaluates the reliability of the offset value as high. If the amount of rotation of the Z axis is small, for example, the output for the Z axis of the magnetic sensor 2 has not changed largely, and it is thus considered that the reliability of the offset value $z_o$ of the Z axis is low. In this case, if each of the reference axes is weighted in accordance with the information on the reliability as described above, it is possible to prevent the offset value $z_o$ for the Z axis from largely changing from a value before the update.

Moreover, the offset value calculation section 22 may calculate detection sensitivity of the magnetic sensor 2 in addition to the offset values of the magnetic sensor 2 based on the detection result of the gyroscope 3. Specifically, if one reference axis is set to an axis of interest and it is determined that the axis of interest has rotated by 180 degrees or more from a direction coincident with the direction of the geomagnetism to a direction opposite to the direction of the geomagnetism, the output value of the magnetic sensor 2 during this rotation contains both the maximum value and the minimum value. The offset value calculation section 22 calculates a value of a parameter relating to the current sensitivity of the axis of interest using the maximum value and the minimum value, and updates a parameter stored in the storage unit 12 to the newly calculated value. In this way, if it is determined that the direction of the mobile device 1 has certainly changed by 180 degrees or more based on the detection result of the gyroscope 3, the offset value calculation section 22 can update the parameter relating to the detection sensitivity using the output of the magnetic sensor 2 during the change.

Moreover, the geomagnetic direction identification section 23 may evaluate reliability of the identified direction of the geomagnetism using the detection result by the gyroscope 3. A change in direction of the geomagnetism and a change in the direction of the mobile device 1 detected by the gyroscope 3 must generally coincide with each other as described above. If a corresponding change in the output of the gyroscope 3 is not observed but the output of the magnetic sensor 2 changes while the offset values are not updated, it is estimated that the change in the output of the magnetic sensor 2 is not generated by the change in the direction of the geomagnetism as a result of a change in the direction of the mobile device 1 but by a change in a magnetic environment around the mobile device 1. The geomagnetism direction identification section 23 outputs, for the information on the direction of the geomagnetism identified by the current output value of the magnetic sensor 2, an index value indicating that the reliability thereof is low along therewith in this case. Conversely, if the detection result by the gyroscope 3 corresponding to a change in the direction of the geomagnetism is acquired, an index value indicating that the reliability of the information on the direction of the geomagnetism is high is output when the direction of the geomagnetism is identified. The application execution section 24 determines, by referring to the information on the reliability, to what degree the information on the direction of the geomagnetism identified by the geomagnetism direction identification section 23 is relied upon in the processing carried out by itself. For example, the application execution section 24 may ignore the information on the direction of the geomagnetism if it is determined that the reliability of the direction of the geomagnetism identified by the geomagnetism direction identification section 23 is low.

If the mobile device 1 according to the embodiment of the present invention described above is used, the acquisition timing of the sampling data items D used for the calibration of the magnetic sensor 2 is determined based on the detection result of the gyroscope 3, and hence the sampling data items D allowing the precise calibration can be acquired compared with the case where the calibration is carried out only based on the output data of the magnetic sensor 2. Particularly, if the magnetic field around the mobile device 1 varies, the method of carrying out the calibration using only the output data of the magnetic sensor 2 may misrecognize the variation of the magnetic field as variation of the geomagnetism caused by a change in the posture of the mobile device 1, and may carry out incorrect calibration. The detection result by the gyroscope 3 for detecting a change in the posture of the mobile device 1 independently of the magnetic sensor 2 is used according to this embodiment, and new sampling data item D can be surely acquired when a change in the posture of the mobile device 1 occurs.

The embodiment described above is not the only embodiment of the present invention. For example, though the acquisition timing of the sampling data items D is determined based on the detection result by the gyroscope 3 in the above description, how to determine the acquisition timing is not limited to this case, and the mobile device 1 according to the embodiment of the present invention may determine the acquisition timing of the sampling data items D using another type of sensor for detecting the posture of the mobile device 1. As a specific example, the mobile device 1 according to the embodiment of the present invention may determine the acquisition timing of the sampling data items D using a detection result by an acceleration sensor for detecting a change in the direction of the gravitational acceleration.

While there have been described what are at present considered to be certain embodiment of the invention, it will be understood that various modifications may be made thereto, and it is intended that the appended claims cover all such modifications as fall within the true spirit and scope of the invention.

What is claimed is:

1. A mobile device comprising:
a magnetic sensor;
a posture detection sensor for detecting a posture of the mobile device independently of the magnetic sensor;
a sampling data acquisition section for acquiring output data of the magnetic sensor as a plurality of sampling data items in a plurality of states in which the posture detection sensor determines that the mobile device is directed in directions different from one another, the plurality of sampling data items respectively corresponding to the plurality of states;

an offset value calculation section for separately calculating a respective offset value for each of a plurality of orthogonal reference axes of the magnetic sensor, which are estimated to be output by the magnetic sensor when the magnetic sensor is not sensing geomagnetism based on the acquired plurality of sampling data items; and a storage unit for storing the respective offset values, wherein the offset value calculation section separately calculates a new offset value and evaluates a reliability of the new offset value, and updates a corresponding one of the offset values stored in the storage unit in accordance with the reliability of the new offset value such that: (i) when the reliability of the new offset value is high, the corresponding one of the offset values stored in the storage unit is replaced with the new offset value, and (ii) when the reliability of the new offset value is low, the corresponding one of the offset values stored in the storage unit is changed toward, but not replaced by, the new offset value.

2. The mobile device according to claim 1, wherein the sampling data acquisition section acquires the plurality of sampling data items in a plurality of states in which the posture detection sensor determines that the mobile device is directed in directions different from one another by a predetermined angle or larger, the plurality of sampling data items respectively corresponding to the plurality of states.

3. The mobile device according to claim 1, wherein the offset value calculation section evaluates the reliability of the newly calculated offset value based on the offset value which has been stored and the newly calculated offset value.

4. The mobile device of claim 1, wherein the offset value calculation section evaluates the reliability of the new offset value by evaluating a difference between the new offset value and the corresponding one of the offset values stored in the storage unit, whereby a higher difference indicates a lower reliability and a lower difference indicates a higher reliability.

5. The mobile device of claim 1, wherein the offset value calculation section evaluates the reliability of the new offset value by evaluating a difference between a measured orientation of the mobile device using the new offset value and a measured orientation of the mobile device using the posture detection sensor, whereby a higher difference indicates a lower reliability and a lower difference indicates a higher reliability.

6. A calibration method for a magnetic sensor for a mobile device including the magnetic sensor and a posture detection sensor for detecting a posture of the mobile device independently of the magnetic sensor, the calibration method comprising:

acquiring output data of the magnetic sensor as a plurality of sampling data items in a plurality of states in which the posture detection sensor determines that the mobile device is directed in directions different from one another, the plurality of sampling data items respectively corresponding to the plurality of states;

separately calculating a respective offset value for each of a plurality of orthogonal reference axes of the magnetic sensor, which are estimated to be output by the magnetic sensor when the magnetic sensor is not sensing geomagnetism based on the acquired plurality of sampling data items; and storing the respective offset values in a storage unit, wherein the calculating step includes separately calculating a new offset value and evaluating a reliability of the new offset value, and updating a corresponding one of the offset values stored in the storage unit in accordance with the reliability of the new offset value such that: (i) when the reliability of the new offset value is high, the corresponding one of the offset values stored in the storage unit is replaced with the new offset value, and (ii) when the reliability of the new offset value is low, the corresponding one of the offset values stored in the storage unit is changed toward, but not replaced by, the new offset value.

7. A non-transitory computer-readable information storage medium having a calibration program stored thereon, the calibration program being used for a magnetic sensor for a mobile device including the magnetic sensor and a posture detection sensor for detecting a posture of the mobile device independently of the magnetic sensor, the calibration program including instructions that cause a computer to:

acquiring output data of the magnetic sensor as a plurality of sampling data items in a plurality of states in which the posture detection sensor determines that the mobile device is directed in directions different from one another, the plurality of sampling data items respectively corresponding to the plurality of states; and separately calculating a respective offset value for each of a plurality of orthogonal reference axes of the magnetic sensor, which are estimated to be output by the magnetic sensor when the magnetic sensor is not sensing geomagnetism based on the acquired plurality of sampling data items; and storing the respective offset values in a storage unit, wherein the calculating step includes separately calculating a new offset value and evaluating a reliability of the new offset value, and updating a corresponding one of the offset values stored in the storage unit in accordance with the reliability of the new offset value such that: (i) when the reliability of the new offset value is high, the corresponding one of the offset values stored in the storage unit is replaced with the new offset value, and (ii) when the reliability of the new offset value is low, the corresponding one of the offset values stored in the storage unit is changed toward, but not replaced by, the new offset value.

* * * * *